United States Patent
Chen et al.

(10) Patent No.: US 7,483,316 B2
(45) Date of Patent: Jan. 27, 2009

(54) METHOD AND APPARATUS FOR REFRESHING PROGRAMMABLE RESISTIVE MEMORY

(75) Inventors: Chieh Fang Chen, Panchiao (TW); Yi-Chou Chen, Cupertino, CA (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/777,848

(22) Filed: Jul. 13, 2007

(65) Prior Publication Data

US 2008/0266933 A1    Oct. 30, 2008

Related U.S. Application Data

(60) Provisional application No. 60/913,606, filed on Apr. 24, 2007.

(51) Int. Cl.
  G11C 7/00 (2006.01)
  G11C 11/00 (2006.01)
(52) U.S. Cl. .................. 365/191; 365/148; 365/163
(58) Field of Classification Search .......... 365/148, 365/163
  See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 4,959,812 A | 9/1990 | Momodomi et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,515,488 A | 5/1996 | Stephens, Jr. | |
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |

(Continued)

FOREIGN PATENT DOCUMENTS

WO    0079539    12/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Ly D Pham
(74) *Attorney, Agent, or Firm*—Kenta Suzue; Haynes Beffel & Wolfeld LLP

(57) ABSTRACT

Nonvolatile memory cells with programmable resistive memory elements, such as chalcogenide material elements, undergo a refresh operation. A refresh operation includes a hot signal and a cold signal, where the hot signal has higher power than a reset signal, and a cold signal has a longer duration than a set signal.

22 Claims, 11 Drawing Sheets

U.S. PATENT DOCUMENTS

| | | | |
|---|---|---|---|
| 5,920,788 A | 7/1999 | Reinberg | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan et al. | |
| 6,025,220 A | 2/2000 | Sandhu | |
| 6,031,287 A | 2/2000 | Harshfield | |
| 6,034,882 A | 3/2000 | Johnson et al. | |
| 6,077,674 A | 6/2000 | Schleifer et al. | |
| 6,077,729 A | 6/2000 | Harshfield | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,314,014 B1 | 11/2001 | Lowrey et al. | |
| 6,320,786 B1 | 11/2001 | Chang et al. | |
| 6,339,544 B1 | 1/2002 | Chiang et al. | |
| 6,351,406 B1 | 2/2002 | Johnson et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,534,781 B2 | 3/2003 | Dennison | |
| 6,545,903 B1 | 4/2003 | Wu | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,579,760 B1 | 6/2003 | Lung et al. | |
| 6,586,761 B2 | 7/2003 | Lowrey | |
| 6,589,714 B2 | 7/2003 | Maimon et al. | |
| 6,593,176 B2 | 7/2003 | Dennison | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,744,088 B1 | 6/2004 | Dennison | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,815,704 B1 | 11/2004 | Chen | |
| 6,830,952 B2 | 12/2004 | Lung | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung et al. | |
| 6,867,638 B2 | 3/2005 | Saiki et al. | |
| 6,888,750 B2 | 5/2005 | Walker et al. | |
| 6,894,305 B2 | 5/2005 | Yi et al. | |
| 6,903,362 B2 | 6/2005 | Wyeth et al. | |
| 6,909,107 B2 | 6/2005 | Rodgers et al. | |
| 6,927,410 B2 | 8/2005 | Chen | |
| 6,933,516 B2 | 8/2005 | Xu | |
| 6,936,840 B2 | 8/2005 | Sun et al. | |
| 6,937,507 B2 | 8/2005 | Chen | |
| 6,992,932 B2 | 1/2006 | Cohen et al. | |
| 7,023,009 B2 | 4/2006 | Kostylev et al. | |
| 7,033,856 B2 | 4/2006 | Lung et al. | |
| 7,042,001 B2 | 5/2006 | Kim et al. | |
| 7,067,865 B2 | 6/2006 | Lung et al. | |
| 7,132,675 B2 | 11/2006 | Gilton | |
| 7,166,533 B2 | 1/2007 | Happ | |
| 7,214,958 B2 | 5/2007 | Happ | |
| 7,220,983 B2 | 5/2007 | Lung | |
| 2002/0166044 A1* | 11/2002 | Muth | 713/1 |
| 2005/0029502 A1 | 2/2005 | Hudgens | |
| 2005/0093022 A1 | 5/2005 | Lung | |
| 2005/0201182 A1 | 9/2005 | Osada et al. | |
| 2005/0212024 A1 | 9/2005 | Happ | |
| 2005/0215009 A1 | 9/2005 | Cho | |
| 2006/0108667 A1 | 5/2006 | Lung | |
| 2006/0110878 A1 | 5/2006 | Lung et al. | |
| 2006/0284157 A1 | 12/2006 | Chen et al. | |
| 2006/0284158 A1 | 12/2006 | Lung et al. | |
| 2006/0284214 A1 | 12/2006 | Chen | |
| 2006/0284279 A1 | 12/2006 | Lung et al. | |
| 2006/0286709 A1 | 12/2006 | Lung et al. | |
| 2006/0286743 A1 | 12/2006 | Lung et al. | |
| 2007/0030721 A1 | 2/2007 | Segal et al. | |
| 2007/0108077 A1 | 5/2007 | Lung et al. | |
| 2007/0108429 A1 | 5/2007 | Lung | |
| 2007/0108430 A1 | 5/2007 | Lung | |
| 2007/0108431 A1 | 5/2007 | Chen et al. | |
| 2007/0109836 A1 | 5/2007 | Lung | |
| 2007/0109843 A1 | 5/2007 | Lung et al. | |
| 2007/0111429 A1 | 5/2007 | Lung | |
| 2007/0115794 A1 | 5/2007 | Lung | |
| 2007/0117315 A1 | 5/2007 | Lai et al. | |
| 2007/0121363 A1 | 5/2007 | Lung | |
| 2007/0121374 A1 | 5/2007 | Lung et al. | |
| 2007/0126040 A1 | 6/2007 | Lung | |
| 2007/0131922 A1 | 6/2007 | Lung | |
| 2007/0131980 A1 | 6/2007 | Lung | |
| 2007/0138458 A1 | 6/2007 | Lung | |
| 2007/0147105 A1 | 6/2007 | Lung et al. | |
| 2007/0154847 A1 | 7/2007 | Chen et al. | |
| 2007/0155172 A1 | 7/2007 | Lai et al. | |
| 2007/0158632 A1 | 7/2007 | Ho | |
| 2007/0158633 A1 | 7/2007 | Lai et al. | |
| 2007/0158645 A1 | 7/2007 | Lung | |
| 2007/0158690 A1 | 7/2007 | Ho et al. | |
| 2007/0158862 A1 | 7/2007 | Lung | |
| 2007/0161186 A1 | 7/2007 | Ho | |
| 2007/0173019 A1 | 7/2007 | Ho et al. | |
| 2007/0173063 A1 | 7/2007 | Lung | |
| 2007/0176261 A1 | 8/2007 | Lung | |

FOREIGN PATENT DOCUMENTS

| | | |
|---|---|---|
| WO | 0145108 | 6/2001 |

OTHER PUBLICATIONS

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel Non-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horrii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24?m-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martin H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org <http://www.sciencenews.org>, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

"Optimized Thermal Capacitance in a Phase Change Memory Cell Design", IPCOM000141986D, IP.com Prior Art Database, Oct. 18, 2006, 4 pp.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel ?Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

"Thermal Conductivity of Crystalline Dielectrics" in CRC Handbook of Chemistry and Physics, Internet Version 2007, (87th edition), David R. Lide, ed. Taylor and Francis, Boca Raton, FL.

Wicker, Guy et al., Nonvolatile, High Density, High Performance Phase Change Memory, 1999, 'http://klabs.org/richcontent/MAPLDCon99/Papers/P21_Tyson_P.PDF#search=nonvolatile%20high%20density%20high%20performance%20phase%20change%20memory <http://klabs.org/richcontnet/MAPLDCon99/Papers/P21_Tyson_P.PDF#search= 'nonvolatile%20high%20density%20high%20performance%20phase%20change%20memory>', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-Vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Chao, D-S. et al., "Low Programming Current Phase Change Memory Cell with Double gst Thermally Confined Structure," VLSI-TSA 2007, International symposium Apr. 23-25, 2007, 2pp.

* cited by examiner

METHOD AND APPARATUS FOR REFRESHING PROGRAMMABLE RESISTIVE MEMORY

BACKGROUND OF THE INVENTION

1. Field of the Invention

The present invention relates to high density memory devices based on programmable resistive material, like phase change based memory materials, and to methods for operating such devices.

2. Description of Related Art

Chalcogenide materials are widely used in read-write optical disks. These materials have at least two solid phases, generally amorphous and generally crystalline. Laser signals are used in read-write optical disks to switch between phases and to read the optical properties of the material after the phase change.

Chalcogenide materials also can be caused to change phase by application of electrical current. This property has generated interest in using programmable resistive material to form nonvolatile memory circuits.

One direction of development has been toward using small quantities of programmable resistive material, particularly in small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

U.S. Patent application Publication No. US-2004-0026686-A1 describes a phase change memory cell in which the phase change element comprises a side wall on an electrode/dielectric/electrode stack. Data is stored by causing transitions in the phase change material between amorphous and crystalline states using current. Current heats the material and causes transitions between the states. The change from the amorphous to the crystalline state is generally a lower current operation. The change from crystalline to amorphous, referred to as reset herein, is generally a higher current operation. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material.

Accordingly, an opportunity arises to devise methods and structures that form memory cells with structures that use small quantities of programmable resistive material.

SUMMARY OF THE INVENTION

One aspect of the technology is a nonvolatile integrated circuit comprising at least one nonvolatile memory cell and control circuitry. The nonvolatile memory cell comprises a programmable resistive element having multiple physical states to store data. The control circuitry applies multiple electrical signals to the nonvolatile memory cell. The multiple electrical signals include 1) signals applied to the nonvolatile memory cell to store data, and 2) signals applied to the nonvolatile memory cell to maintain an ability of the nonvolatile memory cell to store data. The former—signals applied to said at least one nonvolatile memory cell to store data—includes a reset signal to cause the programmable resistive element of the nonvolatile memory cell to store a first physical state, and a set signal to cause the programmable resistive element of the nonvolatile memory cell to store a second physical state. The latter—signals applied to the nonvolatile memory cell to maintain an ability of the nonvolatile memory cell to store data—includes a hot signal to cause the programmable resistive element of the nonvolatile memory cell to store the first physical state, and a cold signal to cause the programmable resistive element of the nonvolatile memory cell to store the second physical state. The hot signal is applied to the programmable resistive element at a higher power relative to the reset signal, and the cold signal is applied to the programmable resistive element for a longer duration relative to the set signal.

In one embodiment, the nonvolatile memory cell has a lifetime of at least 10 million cycles of the reset and set signals.

In another embodiment, the control circuitry applies at least one cycle of hot and cold signals, after an interval of within which multiple cycles of the reset and set signals occurs or is likely to occur. In various embodiments, the interval is determined by a timer, by counting a number of cycles of the reset and set signals, or by a random number of cycles of the reset and set signals. In other embodiment, the interval ends after the nonvolatile memory cell fails to correctly respond to the reset signal, or the interval ends after the nonvolatile memory cell fails to correctly respond to said set signal.

In further embodiments, the control circuitry applies at least one cycle of hot and cold signals during power up events of a machine including the circuit, or prior to applying any of the reset and set signals.

In some embodiments, the hot signal is applied to cause the programmable resistive element of the nonvolatile memory cell to become substantially totally amorphous. In some embodiments, the cold signal is applied to cause the programmable resistive element of the nonvolatile memory cell to become substantially totally crystalline.

In yet other embodiments, the control circuitry applies at least one cycle of hot and cold signals, where the cycle includes multiple hot signals followed by at least one cold signal, or where the cycle includes at least hot signal followed by multiple cold signals.

Another aspect of the technology is a method of operating a nonvolatile integrated circuit with a nonvolatile memory cell including a programmable resistive element storing data in a plurality of physical states. The method comprises the following steps:

applying signals to said nonvolatile memory cell to store data, comprising the following substeps:

applying a reset signal to cause the programmable resistive element of said nonvolatile memory cell to store a first physical state of the plurality of physical states; and applying a set signal to cause the programmable resistive element of said nonvolatile memory cell to store a second physical state of the plurality of physical states; and applying signals to said nonvolatile memory cell to maintain an ability of said at least one nonvolatile memory cell to store data, comprising the following substeps:

applying a hot signal to cause the programmable resistive element of said one nonvolatile memory cell to store the first physical state of the plurality of physical states, wherein the hot signal is applied to the programmable resistive element at a higher power relative to the reset signal; and applying a cold signal to cause the programmable resistive element of said nonvolatile memory cell to store the second physical state of the plurality of physical states, wherein the cold signal is applied to the programmable resistive element for a longer duration relative to the set signal.

Various embodiments are disclosed herein.

A further aspect of the technology is a nonvolatile integrated circuit with a nonvolatile memory cell including a programmable resistive element storing data in a plurality of physical states, comprising:

means for applying signals to said nonvolatile memory cell to store data, comprising:

means for applying a reset signal to cause the programmable resistive element of said nonvolatile memory cell to store a first physical state of the plurality of physical states; and means for applying a set signal to cause the programmable resistive element of said nonvolatile memory cell to store a second physical state of the plurality of physical states; and means for applying signals to said nonvolatile memory cell to maintain ability of said at least one nonvolatile memory cell to store data, comprising:

means for applying a hot signal to cause the programmable resistive element of said one nonvolatile memory cell to store the first physical state of the plurality of physical states, wherein the hot signal is applied to the programmable resistive element at a higher power relative to the reset signal; and means for applying a cold signal to cause the programmable resistive element of said nonvolatile memory cell to store the second physical state of the plurality of physical states, wherein the cold signal is applied to the programmable resistive element for a longer duration relative to the set signal.

A yet further aspect of the technology is a method of manufacturing a nonvolatile integrated circuit with a nonvolatile memory cell including a programmable resistive element storing data in a plurality of physical states, as disclosed herein.

DETAILED DESCRIPTION

The various embodiments of the technology combine hot and cold signals, in addition to the program and erase signals (also called set and reset signals for programmable resistive memory cells). Reset signals, set signals, hot signals, and cold signals have a voltage, a duration, and a peak power that are chosen according to the type and geometry of the memory cell. In any particular embodiment, the hot signal has a higher power than the reset signal, and the cold signal has a longer duration than the set signal. The sequence of more hot signals followed by one or more cold signals is called a refresh operation. These signals are applied to nonvolatile memory cells with programmable resistive elements, also called programmable resistive memory cells. Details of some embodiments follow at the end of the detailed description.

Figure 1:
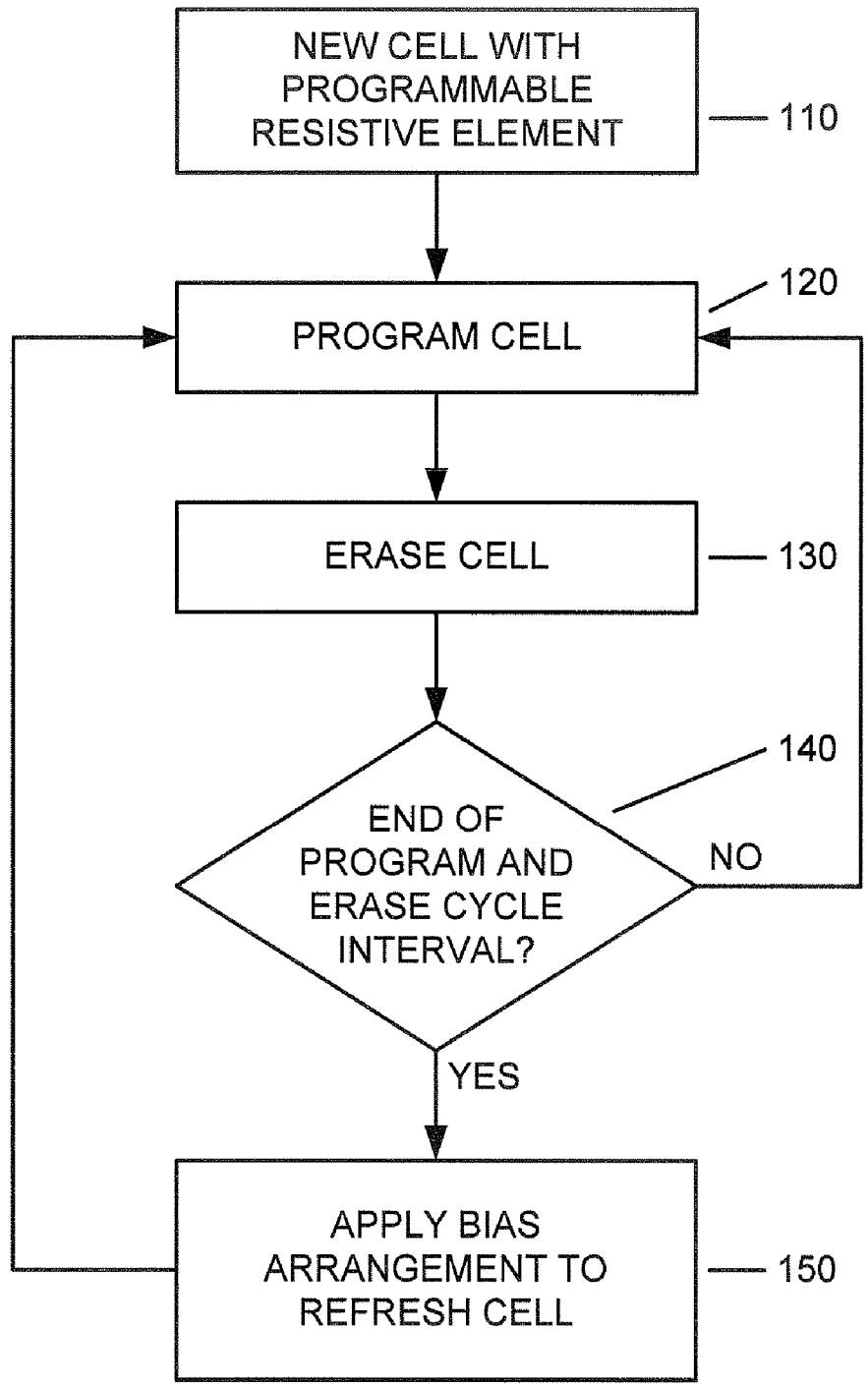
FIG. 1 illustrates a representative process for changing refreshing a programmable resistive memory cell following multiple program and erase cycles.

FIG. 1 illustrates a representative process for refreshing a programmable resistive memory cell following multiple program and erase cycles. A new memory cell 110 has not yet experienced any program and erase cycles. At 120 and 130, the memory cell is programmed and erased via first and second bias arrangements. At 140, a determination occurs as to whether the interval of program and erase cycles is over. The interval is determined by counting a number of program and erase cycles, or by other methods. If the interval is not yet over, the memory cell is programmed and erased at 120 and 130 again. Otherwise, at 150 the programmable resistive memory cell is refreshed.

Figure 2:
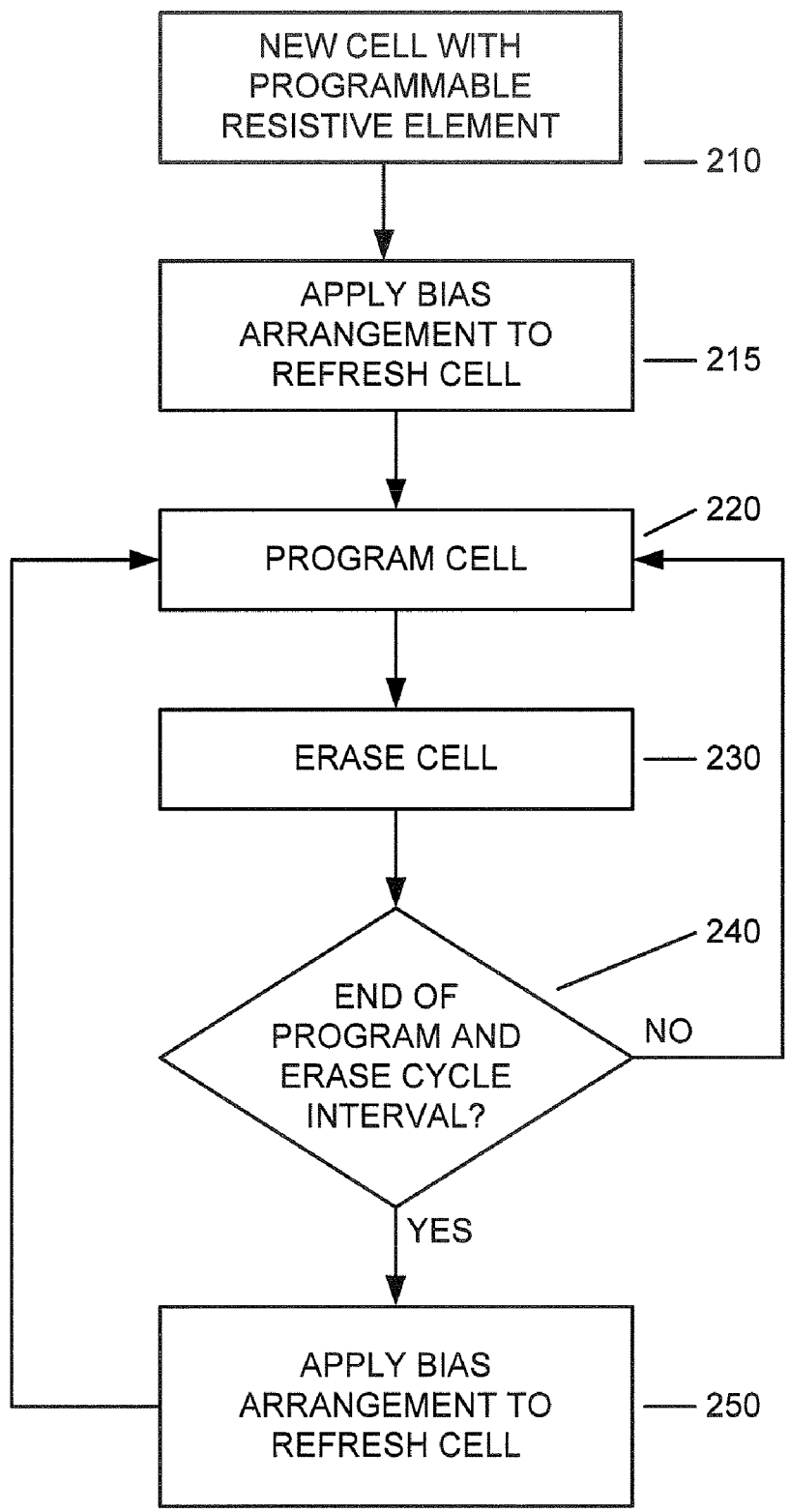
FIG. 2 illustrates a representative process for refreshing a programmable resistive memory cell prior to any program and erase cycles, and refreshing the programmable resistive memory cell following multiple program and erase cycles.

FIG. 2 illustrates a representative process for refreshing a programmable resistive memory cell prior to any program and erase cycles, and refreshing the programmable resistive memory cell following multiple program and erase cycles. The process is similar to the process of FIG. 1. However, prior to any program and erase cycles at steps 220 and 230, the cell is refreshed at 215.

Figure 3:
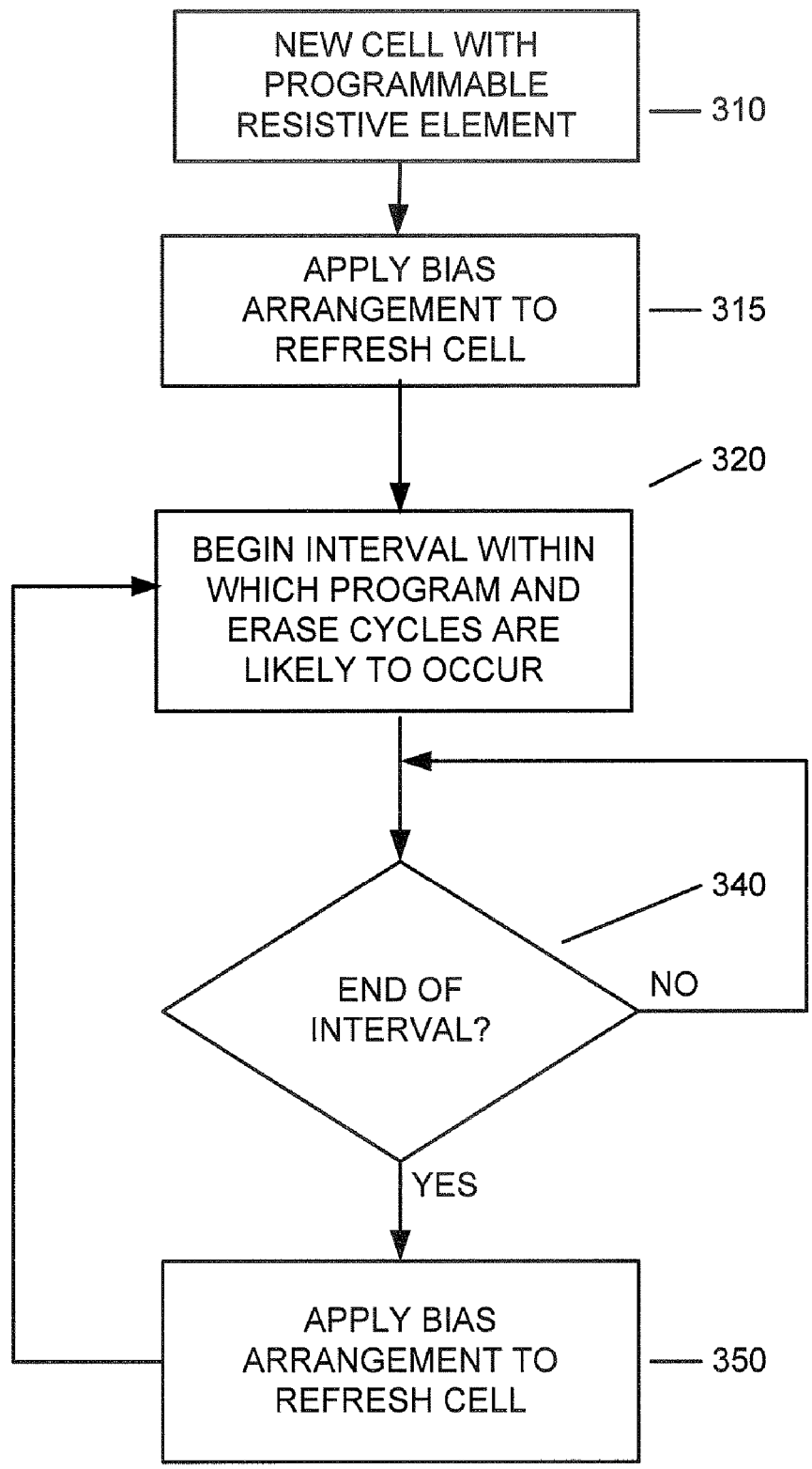
FIG. 3 illustrates a representative process for refreshing a programmable resistive memory cell prior to any program and erase cycles, and refreshing the programmable resistive memory cell following an interval in which program and erase cycles are likely to occur.

FIG. 3 illustrates a representative process for refreshing a programmable resistive memory cell prior to any program and erase cycles, and refreshing the programmable resistive memory cell following an interval in which program and erase cycles are likely to occur. A new memory cell 310 has not experienced any program and erase cycles yet. At 315, the cell is refreshed. At 320, an interval begins within which program and erase cycles are likely to occur. Programming and erasing occur via first and second bias arrangements. At 340, a determination occurs as to whether the interval is over. If not, the interval continues. Otherwise, at 350 the programmable resistive memory cell is changed via a third bias arrangement which refreshes the cell. In various embodiments, the interval ends after a random number of program and erase cycles, and/or when the memory cell fails to erase. In another embodiment, the interval includes the time between power up events, such as a time from supplying power to a machine including the memory cell until powering off the machine and powering it on again. In this way, the third bias arrangement is applied after turning on the machine.

Figure 4:
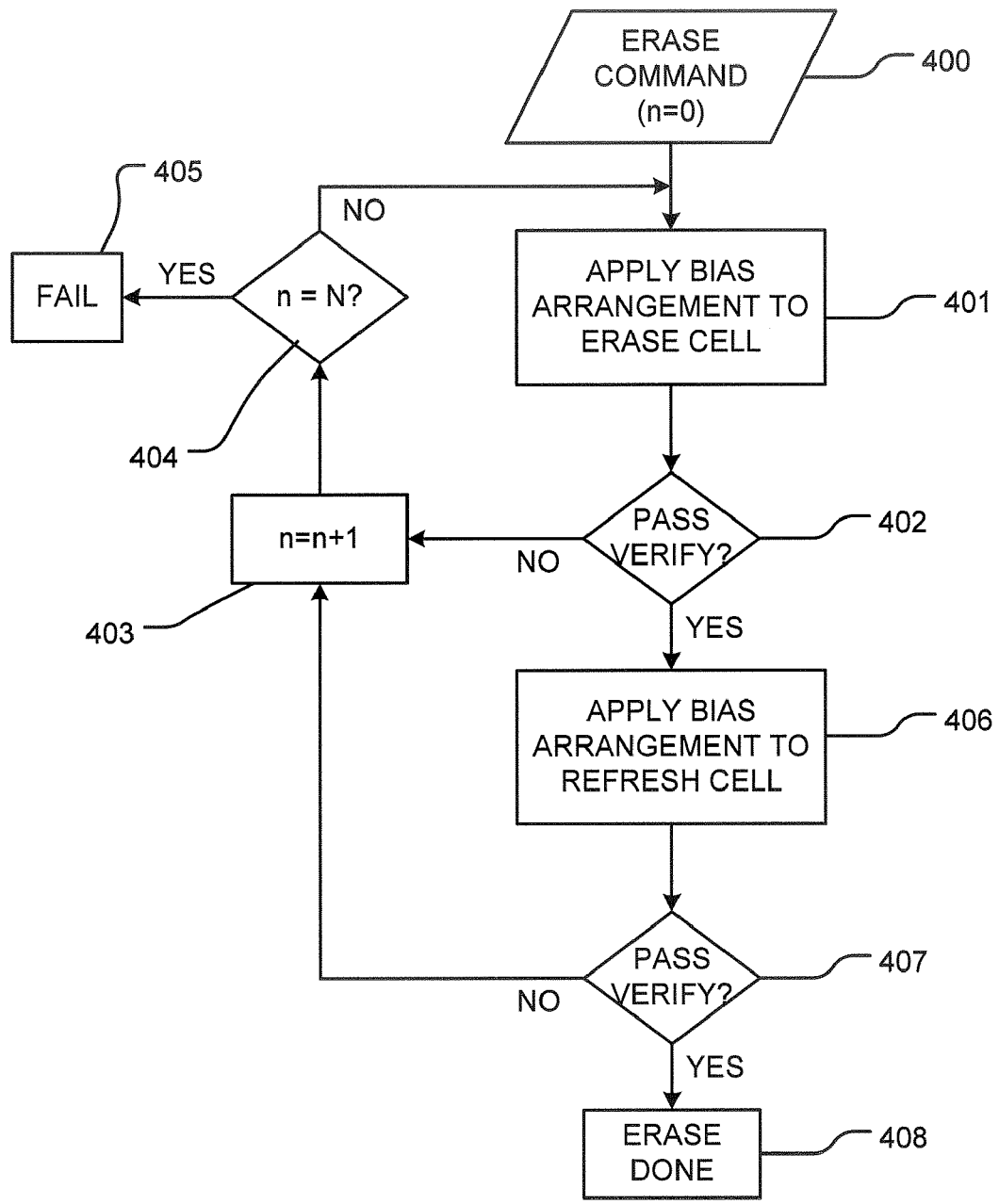
FIG. 4 is a flow chart for an erase process including a refresh operation.
Figure 5:
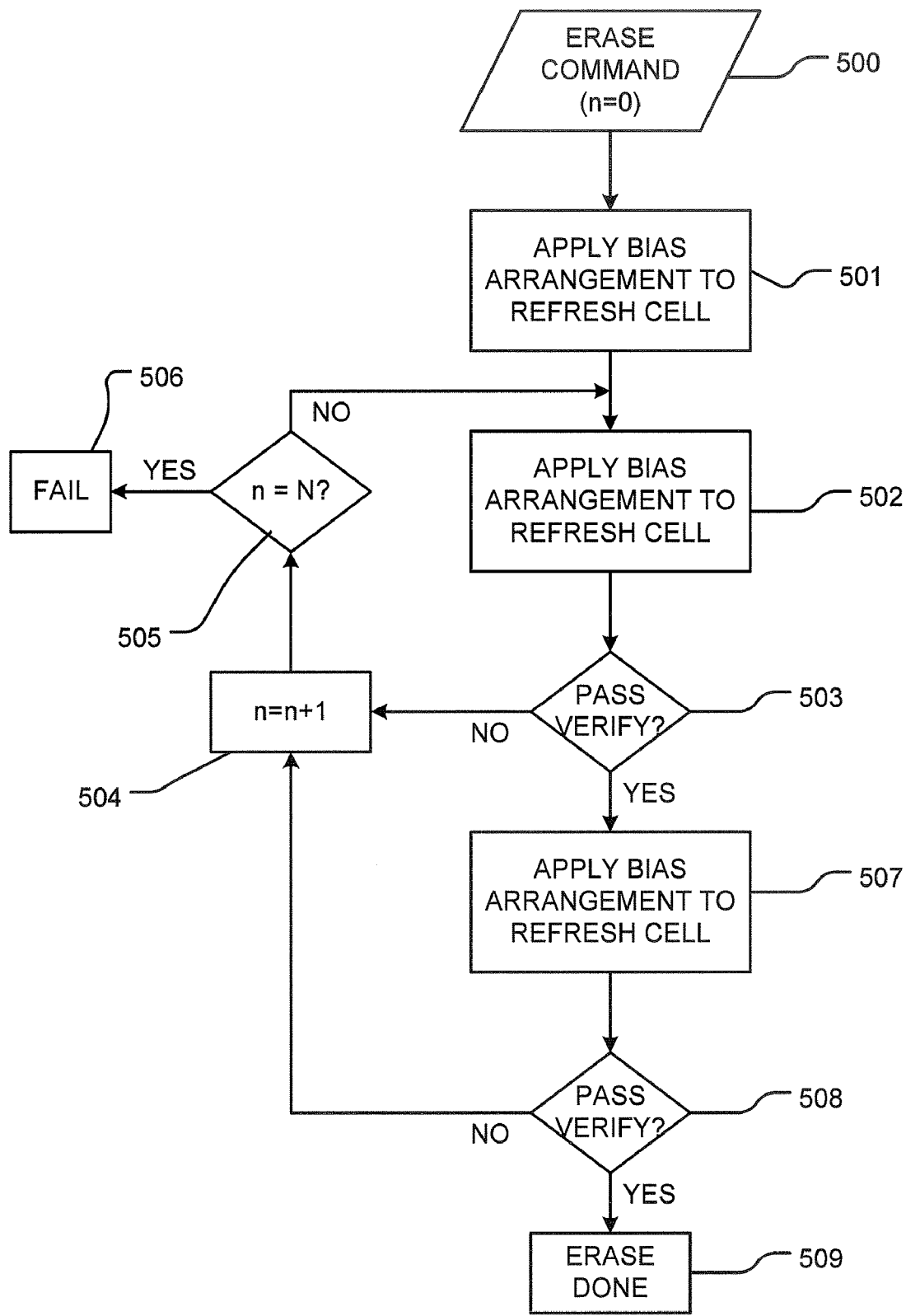
FIG. 5 is a flow chart of an alternative erase process including a refresh operation.

FIG. 4 is a flow chart for an erase process including a refresh operation, and FIG. 5 is a flow chart of an alternative erase process including a refresh operation.

In FIG. 4, an erase procedure is initiated by an erase command (block 400). Heuristically at this point, an index n is set to zero for use in the erase procedure. The erase command in some implementations corresponds with a block or sector erase operation. In response to the erase command, a biasing procedure is instituted. In one embodiment, the first operation in the biasing procedure is to apply a bias arrangement that erases the memory cells (block 401). Thus, in the next step, the algorithm determines whether the memory cells passed the verify operation (block 402). If the cell does not pass verify, then the index n is incremented (block 403), and the algorithm determines whether the index has reached a pre-specified maximum number N of retries (block 404). If the maximum number of retries has been executed without passing verify, then the procedure fails (block 405). If the maximum number of retries has not been executed at block 404, then the procedure returns to block 402 to retry the erase bias arrangement. If at block 402, the memory cell passes verify, then a refresh operation is applied (block 406). After the erase operation, an erase verify operation is repeated (block 407). If the memory cell does not pass verify, then the algorithm loops to block 403, increments the index n and retries or fails depending on whether the maximum number of retries has been attempted. If at block 407, the algorithm passes, then the erase procedure is finished (block 408).

In FIG. 5, an erase procedure is initiated by an erase command (block 500). Heuristically at this point, an index n is set to zero for use in the erase procedure. The erase command in some implementations corresponds with a block or sector erase operation. In response to the erase command, a biasing procedure is instituted. In this example, after the erase command, a refresh bias arrangement is applied (block 501). The next operation in the biasing procedure is to apply a bias arrangement that erases memory cells (block 502). Because of the previous refresh bias arrangement of block 501, a more uniform result is achieved by the erase bias arrangement. After applying the erase bias arrangement, a state machine or other logic determines whether the erase operation has been successful for each cell in the sector by performing an erase verify operation. Thus, in the next step, the algorithm determines whether the memory cells passed the verify operation (block 503). If the cell does not pass verify, then the index n is incremented (block 504), and the algorithm determines whether the index has reached a pre-specified maximum number N of retries (block 505). If the maximum number of retries has been executed without passing verify, then the procedure fails (block 506). If the maximum number of retries has not been executed at block 505, then the procedure returns to block 502 to retry the erase bias arrangement. If at block 503, the memory cell passes verify, then a refresh bias arrangement is applied (block 507). In some embodiments of the technology, the second charge balancing arrangement of block 507 is not utilized. The lengths in the refresh biasing operation of block 501 and the refresh biasing operation of 507 might be shorter than in embodiments where only one refresh biasing operation is applied. After the refresh biasing operation at block 507, an erase verify operation is repeated (block 508). If the memory cell does not pass verify, then the algorithm loops to block 504, increments the index n and retries or fails depending on whether the maximum number of retries has been attempted. If at block 508, the algorithm passes, then the erase procedure is finished (block 509).

Figure 6:
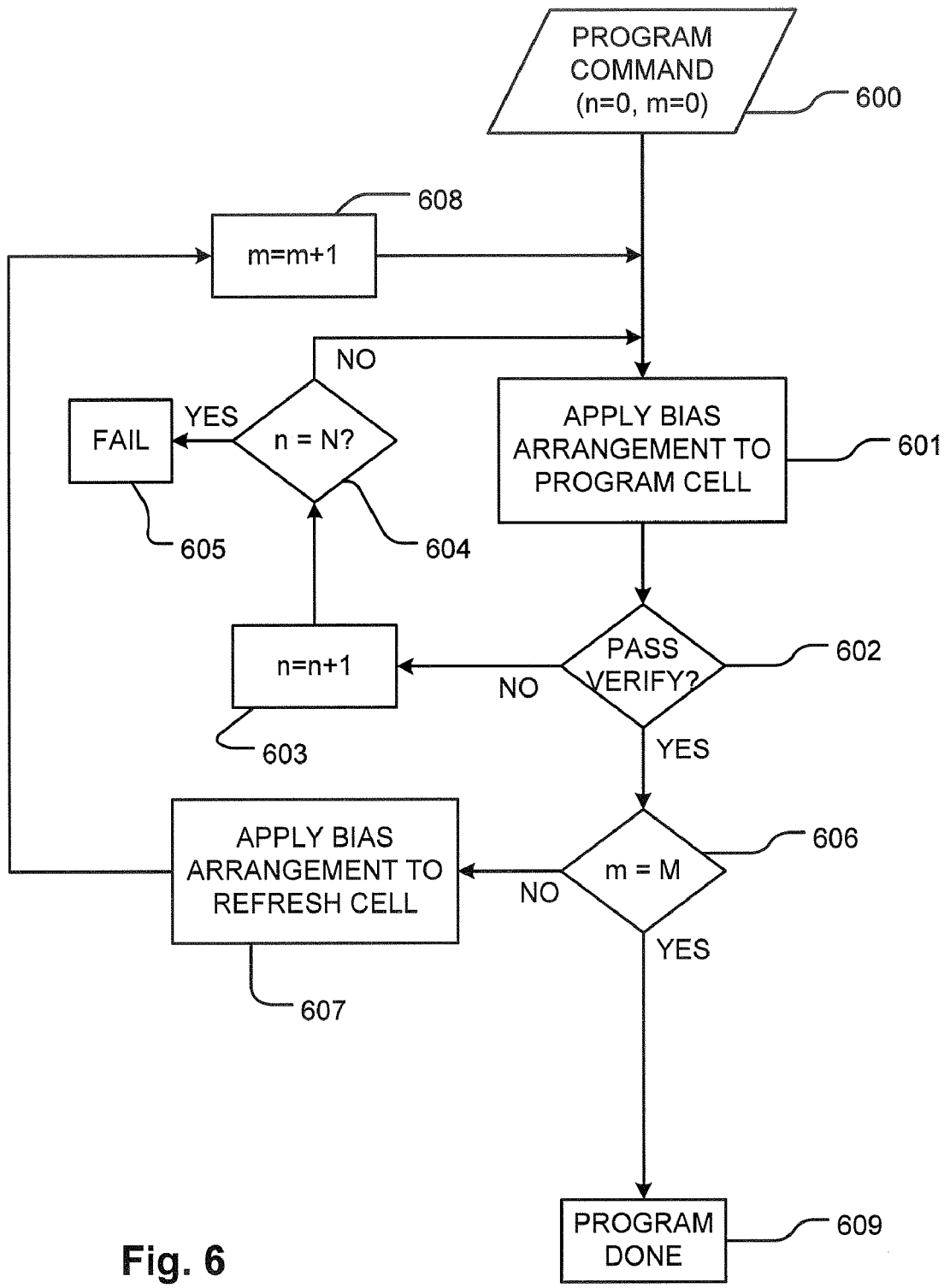
FIG. 6 is a flow chart for a program operation with a refresh operation according to embodiments of the described technology.

FIG. 6 is a flow chart for a program operation with a refresh operation according to embodiments of the described technology. A program procedure is initiated by a program command (block 600) Heuristically at this point, an index n is set to zero for use in the program retry procedure, and an index m is set to zero for use in counting the procedure. In response to the program command, a program biasing procedure is instituted. After applying the program bias arrangement, a state machine or other logic determines whether the program operation has been successful for each cell using a program verify operation. Thus, in the next step, the algorithm determines whether the memory cells passed the verify operation (block 602). If the cell does not pass verify, then the index n is incremented (block 603), and the algorithm determines whether the index has reached a pre-specified maximum number N of retries (block 604). If the maximum number of retries has been executed without passing verify, then the procedure fails (block 605). If the maximum number of retries has not been executed at block 604, then the procedure returns to block 601 to retry the program bias arrangement. If at block 602, the memory cell passes verify, then the algorithm determines whether the specified number of refresh cycles has been executed by determining whether the index m has reached its maximum M (block 606). If the index m is not equal to M, then a refresh operation is adapted for the refill algorithm is applied (block 607). After the refresh operation, the algorithm increments the index m (block 608), and returns two reapply the bias arrangement that induces electron injection at block 601. If the memory cell has undergone the prespecified number of refresh operations, then the algorithm is finished (block 609).

Figure 7:
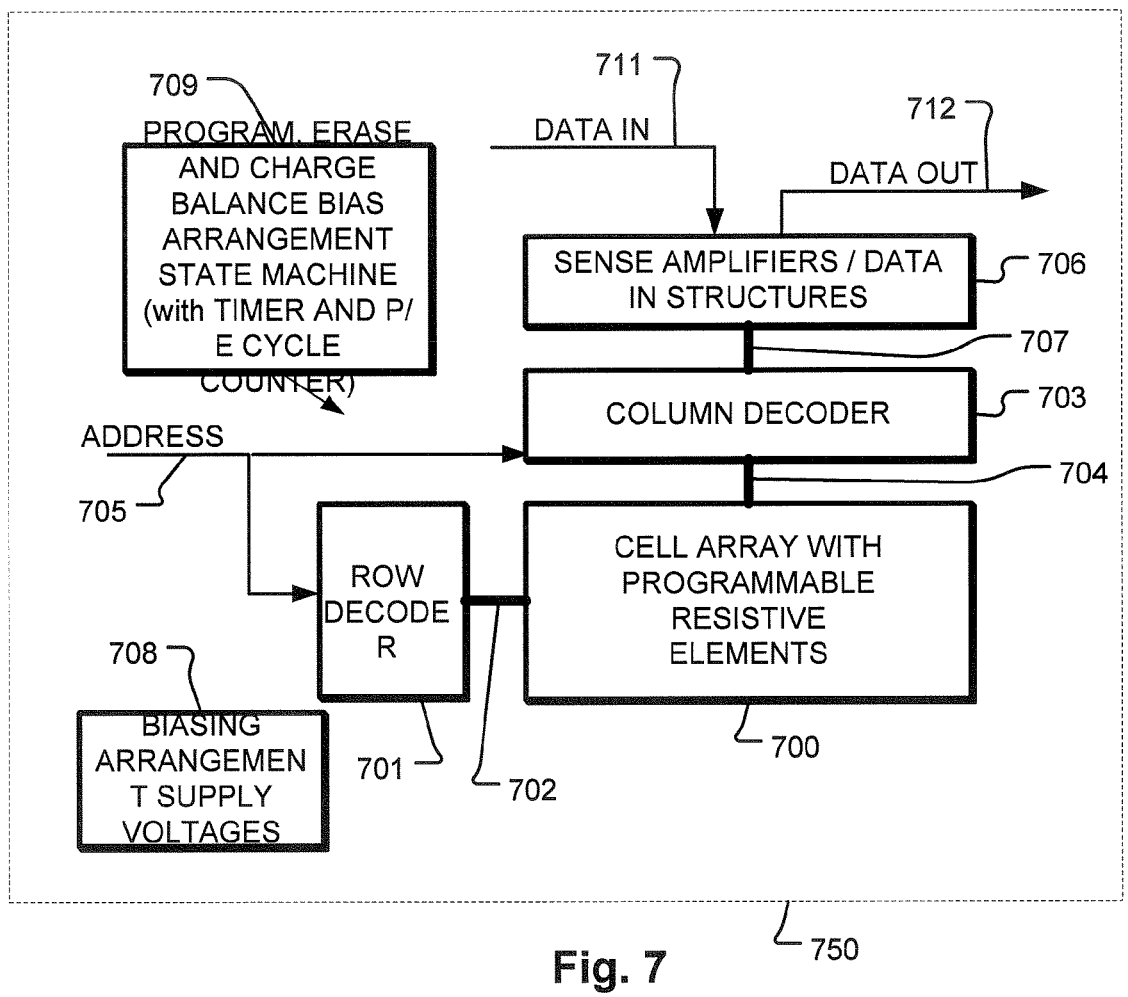
FIG. 7 is a simplified block diagram of an integrated circuit according to an embodiment of the present technology.

FIG. 7 is a simplified block diagram of an integrated circuit according to an embodiment of the present technology. The integrated circuit 750 includes a memory array 700 implemented using programmable memory cells, on a semiconductor substrate. A row decoder 701 is coupled to a plurality of wordlines 702 arranged along rows in the memory array 700. A column decoder 703 is coupled to a plurality of bitlines 704 arranged along columns in the memory array 700. Addresses are supplied on bus 705 to column decoder 703 and row decoder 701. Sense amplifiers and data-in structures in block 706 are coupled to the column decoder 703 via data bus 707. Data is supplied via the data-in line 711 from input/output ports on the integrated circuit 750, or from other data sources internal or external to the integrated circuit 750, to the data-in structures in block 706. Data is supplied via the data-out line 712 from the sense amplifiers in block 706 to input/output ports on the integrated circuit 750, or to other data destinations internal or external to the integrated circuit 750. A bias arrangement state machine 709 controls the application of bias arrangement supply voltages 708, such as for the erase verify and program verify voltages, the first and second bias arrangements for programming and erasing the memory cells, and the third bias arrangement to refresh the programmable resistive memory cell. The bias arrangement state machine 709 also includes circuitry to determine the intervals for applying a refresh signal.

Figure 8:
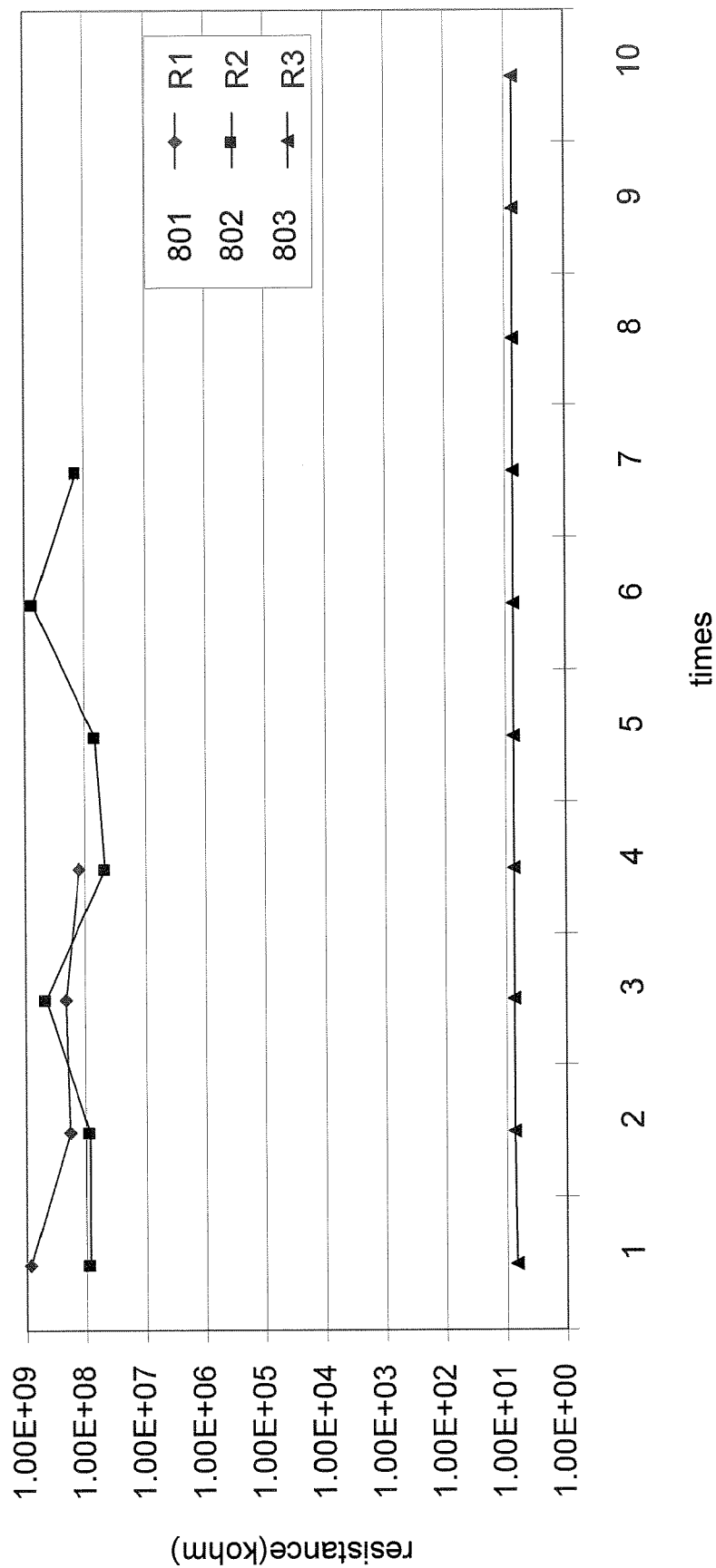
FIG. 8 is a graph of resistance for cells, prior to ad after the refresh operation (with both reset ad set operations).

FIG. 8 is a graph of resistance for cells, prior to and after the refresh operation (with both reset and set operations). Trace R1 801 is the initial resistance of the programmable resistive cell, prior to a refresh operation. Trace R2 802 is the resistance of the programmable resistive cell after a refresh operation, in the reset state. Trace R3 803 is the resistance of the programmable resistive cell after a refresh operation, in the set state.

Figure 9:
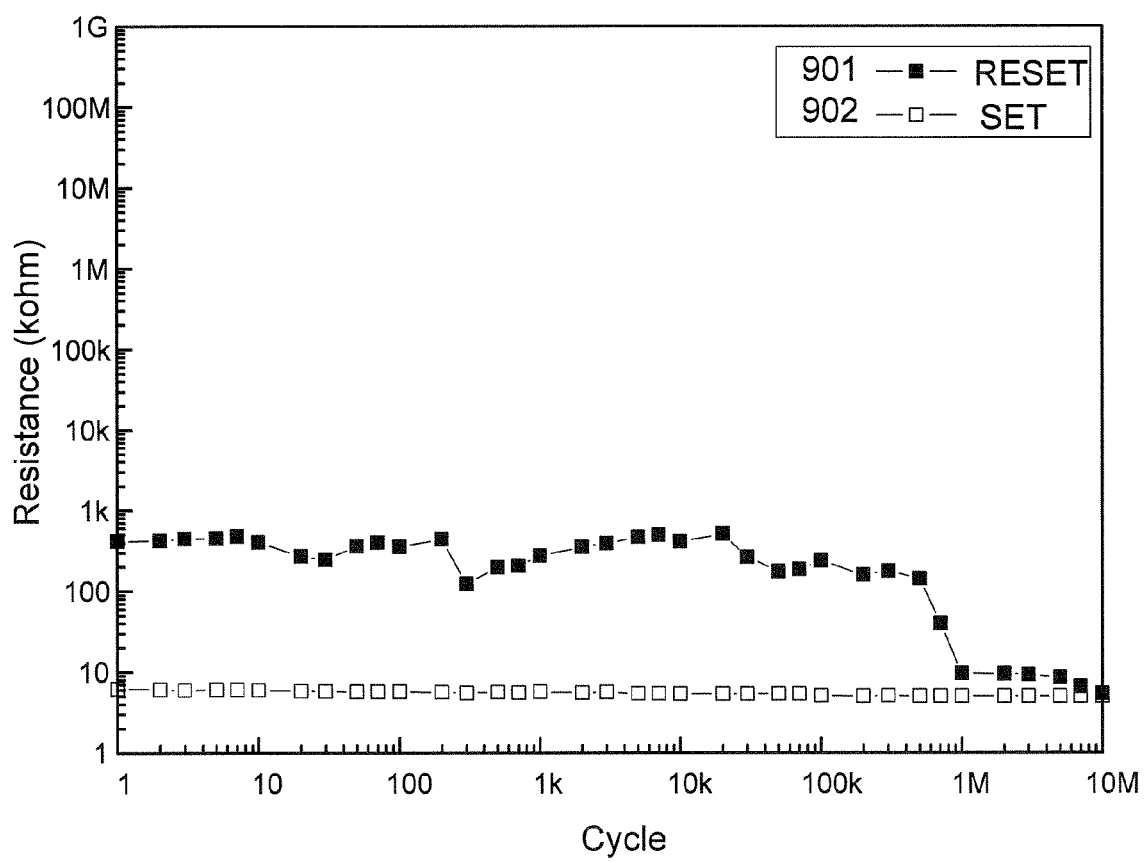
FIGS. 9, 10, and 11 are graphs of resistance for cells, after the refresh operation, showing different types of failures.
Figure 10:
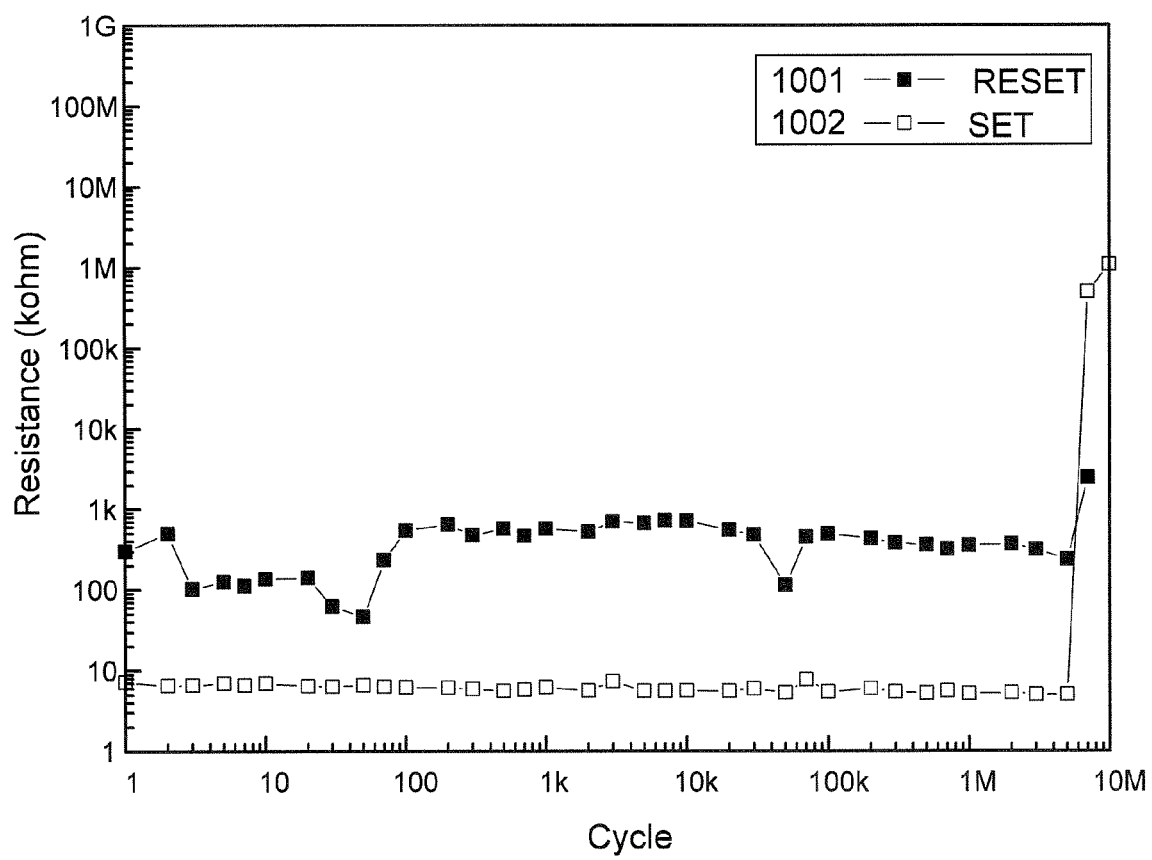
Figure 11:
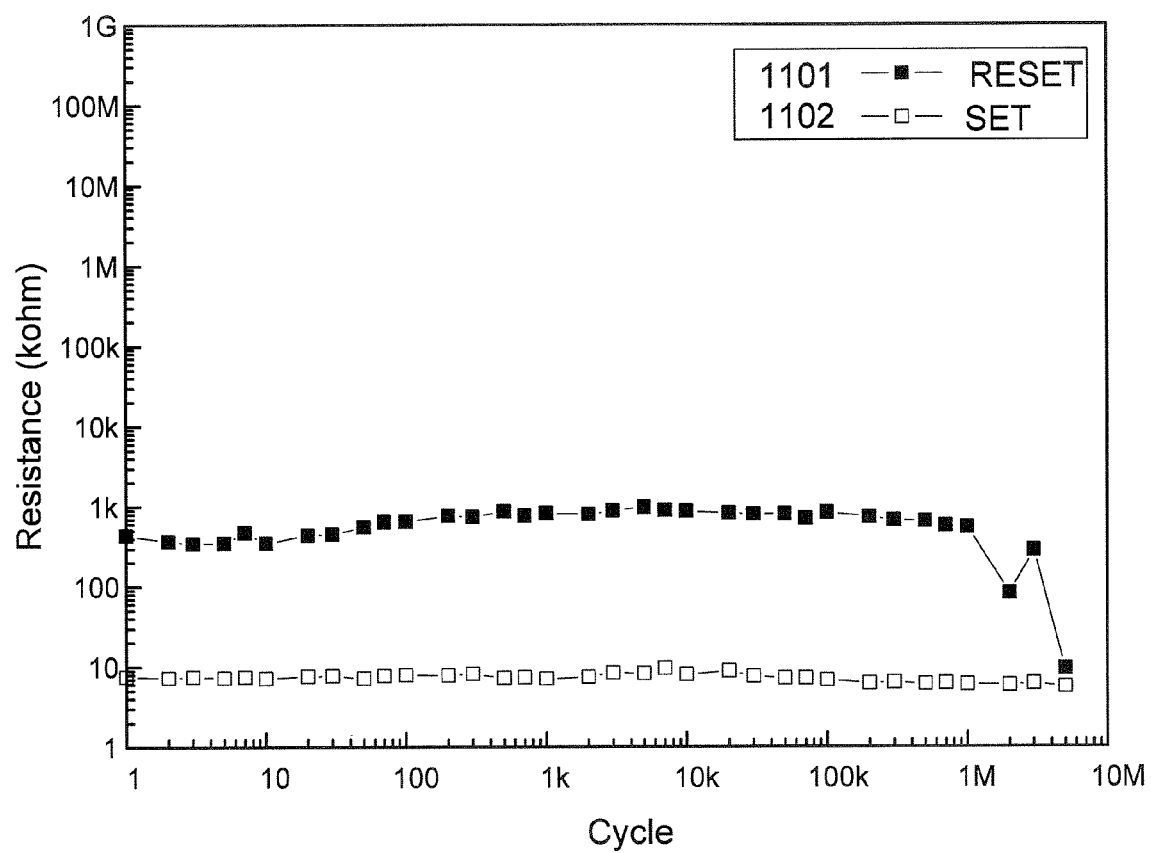

FIGS. 9, 10, and 11 are graphs of resistance for cells, after the refresh operation, showing different types of failures. The chalcogenide material is AGInSbTe, with a TiN top electrode of a mushroom structure. In FIGS. 9, 10, and 11 the conditions of the various signals are as follows:

Hot signal: 12 V 20 ns
Cold signal: 2V 1000 ns
Reset signal: 6 V 20 ns
Set signal: 2V 70 ns
Read signal: 0.5 mV Each cycle of data included reset, read, set, and read signals.

Trace 901 of FIG. 9, trace 1001 of FIG. 10, and trace 1101 of FIG. 11 show the resistance of the programmable resistive memory cell in the reset state. The traces are uneven where, although the cell is nominally in the amorphous state, there are some crystals that are hard to change. Similarly, trace 902 of FIG. 9, trace 1002 of FIG. 10, and trace 1102 of FIG. 11 show the resistance of the programmable resistive memory cell in the set state. FIGS. 9 and 11 show one type of failure mechanism, where the reset state eventually has a resistance similar to the set state. FIG. 10 shows another type of failure mechanism, where the set state eventually has a resistance similar to the reset state.

FIGS. 9, 10 and 11 are data from the same data cell. Prior to each graph, a refresh operation was performed. Although failures occurred within each graph prior to 10 million cycles, when the successful number of cycles are added together for FIGS. 9, 10, and 11, the cell lifetime is well over 10 million cycles.

Sample embodiment data are as follows:

| Symbol | Parameter | Min | Max | Unit | Notes |
|---|---|---|---|---|---|
| $R_{FAB}$ | Fabrication (Uninitialized) Cell Resistance | 5 | 10000 | Kohm | After fabrication but before Initialization and Refresh |
| $R_{INIT}$ | Initialized Cell Resistance | 5 | 100 | Kohm | After Initialization and Refresh when cell is programmable |
| $V_{HP}$ | Hot Pulse Voltage | 6 | 15 | V | |
| $V_{CP}$ | Cold Pulse Voltage | 1 | 3 | V | |
| $t_{PH}$ | Hot Pulse Width | 10 | 100 | ns | |
| $t_{PC}$ | Cold Pulse Width | 80 | 2000 | ns | |
| $t_{HCDEL}$ | Hot-to-Cold Delay | 10 | 1000 | ns | Delay between Hot Pulse and Cold Pulse |
| $HC_{CYC}$ | Hot Pulse plus Cold Pulse Initialization Cycles | 1 | 5 | cycles | Total Hot Pulse + Cold Pulse cycles to achieve Initialization |
| $t_{PRDEL}$ | Delay after Cold Pulse | 10 | 1000 | ns | Delay after Initialization and Reset is completed, before a cell is ready for programming |
| $R_{SET}$ | SET Cell Resistance | 10 | 50 | Kohm | Programmable SET cell resistance after Initialization and Reset Method |
| $R_{RST}$ | RESET Cell Resistance | 200 | 500 | Kohm | Programmable RESET cell resistance after Initialization and Reset Method |
| $V_{SET}$ | Set Programming Voltage | 1 | 2 | V | Normal cell programming |
| $V_{RST}$ | Reset Programming Voltage | 3 | 7 | V | Normal cell programming |
| $t_{SET}$ | Set Pulse Width | 200 | 500 | ns | Normal cell programming |
| $t_{RST}$ | Reset Pulse Width | 20 | 80 | ns | Normal cell programming |
| $DP_{CYC}$ | Data Programming Cycles | 1 | 100 | Mcycles | Data Programming Cycles available after Initialization and Reset Method is employed |

Embodiments of the memory cell include phase change based memory materials, including chalcogenide based materials and other materials, for the programmable resistive element. Data for the graphs were obtained with a mushroom type chalcogenide based cell. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb\ 100-(a+b)$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$ (oboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g. U.S. Pat. No. 6,800,504, and U.S. Patent Application Publication No. US 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical signals. It has been observed that a shorter, higher amplitude signal tends to change the phase change material to a generally amorphous state. A longer, lower amplitude signal tends to change the phase change material to a generally crystalline state. The energy in a shorter, higher amplitude signal is high enough to allow for bonds of the crystalline structure to be broken and short enough to prevent the atoms from realigning into a crystalline state. Appropriate profiles for signals can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, $Pr_xSr_yMnO_3$, $ZrO_x$, or other material that uses an electrical signal to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, $C_{60}$-TCNQ, TCNQ doped with other metal, or any other polymer material that has bistable or multi-stable resistance state controlled by an electrical signal. Further examples of programmable resistive memory materials include GeSbTe, GeSb, NiO, Nb—$SrTiO_3$, Ag—GeTe, $Pr_x$-$Ca_yMnO_3$, ZnO, $Nb_2O_5$, Cr—$SrTiO_3$.

The following are short summaries describing four types of resistive memory materials. The first type is chalcogenide material, such as $Ge_xSb_yTe_z$ where x:y:z=2:2:5, or other compositions with x: 0~5; y: 0~5; z: 0~10. GeSbTe with doping, such as N—, Si—, Ti—, or other element doping is alternatively used.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimater with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

A second type of memory material suitable for use in embodiments is colossal magnetoresistance ("CMR") material, such as $Pr_xCa_yMnO_3$ where x=0.5:0.5, or other compositions with x: 0~1; y: 0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr 100 mTorr. The deposition temperature can range from room temperature to ~600° C., depending on the post deposition treatment condition. A collimater with an aspect ratio of 1~5 can be used to improve the fill-in performance. To improve the fill-in performance, the DC bias of several tens of volts to several hundreds of volts is also used. On the other hand, the combination of DC bias and the collimater can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an anneal time of less than 2 hours.

The thickness of CMR material depends on the design of the cell structure. The CMR thickness of 10 nm to 200 nm can be used for the core material. A buffer layer of YBCO (YBaCuO$_3$, which is a type of high temperature superconductor material) is often used to improve the crystallized state of CMR material. The YBCO is deposited before the deposition of CMR material. The thickness of YBCO ranges from 30 nm to 200 nm.

A third type of memory material is two-element compounds, such as $Ni_xO_y$; $Ti_xO_y$; $Al_xO_y$; $W_xO_y$; $Zn_xO_y$; $Zr_xO_y$; $Cu_xO_y$; etc, where x:y=0.5:0.5, or other compositions with x: 0~1; y: 0~1. An exemplary formation method uses a PVD sputtering or magnetron-sputtering method with reactive gases of Ar, $N_2$, $O_2$, and/or He, etc. at the pressure of 1 mTorr~100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimater with an aspect ratio of 1~5 can be used to improve the fill-in performance. To improve the fill-in performance, the DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr~100 mTorr, using a target of metal oxide, such as Ni, Ti, Al, W, Zn, Zr, or Cu etc. The deposition is usually done at room temperature. A collimater with an aspect ratio of 1~5 can be used to improve the fill-in performance. To improve the fill-in performance, a DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

Yet another formation method uses oxidation by a high temperature oxidation system, such as a furnace or a rapid thermal signal ("RTP") system. The temperature ranges from 200° C. to 700° C. with pure $O_2$ or $N_2/O_2$ mixed gas at a pressure of several mTorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A fourth type of memory material is a polymer material, such as TCNQ with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an anneal time of less than 1 hour.

Another technique for forming a layer of polymer-based memory material is to use a spin-coater with doped-TCNQ solution at a rotation of less than 1000 rpm. After spin-coating, the wafer held (typically at room temperature or temperature less than 200° C.) for a time sufficient for solid-state formation. The hold time ranges from several minutes to days, depending on the temperature and on the formation conditions.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A nonvolatile integrated circuit, comprising:
   at least one nonvolatile memory cell, comprising:
      a programmable resistive element having a plurality of physical states to store data;
   control circuitry applying a plurality of electrical signals to said at least one nonvolatile memory cell, the plurality of electrical signals comprising:
      a plurality of signals applied to said at least one nonvolatile memory cell to store data, including:
         a reset signal to cause the programmable resistive element of said at least one nonvolatile memory cell to store a first physical state of the plurality of physical states;
         a set signal to cause the programmable resistive element of said at least one nonvolatile memory cell to store a second physical state of the plurality of physical states;
      a plurality of signals applied to said at least one nonvolatile memory cell to maintain an ability of said at least one nonvolatile memory cell to store data, including:
         a hot signal to cause the programmable resistive element of said at least one nonvolatile memory cell to store the first physical state of the plurality of physical states, wherein the hot signal is applied to the programmable resistive element at a higher power relative to the reset signal;
         a cold signal to cause the programmable resistive element of said at least one nonvolatile memory cell to store the second physical state of the plurality of physical states, wherein the cold signal is applied to the programmable resistive element for a longer duration relative to the set signal.

2. The circuit of claim 1, wherein said at least one nonvolatile memory cell has a lifetime of at least 10 million cycles of the reset and set signals.

3. The circuit of claim 1, wherein the control circuitry applies at least one cycle of hot and cold signals, after an interval of within which a plurality of cycles of the reset and set signals occurs or is likely to occur.

4. The circuit of claim 1, wherein the control circuitry applies at least one cycle of hot and cold signals, after an interval of within which a plurality of cycles of the reset and set signals occurs or is likely to occur,
   wherein the interval is determined by a timer.

5. The circuit of claim 1, wherein the control circuitry applies at least one cycle of hot and cold signals, after an interval of within which a plurality of cycles of the reset and set signals occurs or is likely to occur,
   wherein the interval is determined by counting a number of cycles of the reset and set signals.

6. The circuit of claim 1, wherein the control circuitry applies at least one cycle of hot and cold signals, after an interval of within which a plurality of cycles of the reset and set signals occurs or is likely to occur,
   wherein the interval is determined by a random number of cycles of the reset and set signals.

7. The circuit of claim 1, wherein the control circuitry applies at least one cycle of hot and cold signals, after an interval of within which a plurality of cycles of the reset and set signals occurs or is likely to occur,
   wherein the interval ends after said at least one nonvolatile memory cell fails to correctly respond to said reset signal.

8. The circuit of claim 1 wherein the control circuitry applies at least one cycle of hot and cold signals, after an interval of within which a plurality of cycles of the reset and set signals occurs or is likely to occur,
   wherein the interval ends after said at least one nonvolatile memory cell fails to correctly respond to said set signal.

9. The circuit of claim 1, wherein the control circuitry applies at least one cycle of hot and cold signals during power up events of a machine including the circuit.

10. The circuit of claim 1, wherein the control circuitry applies at least one cycle of hot and cold signals prior to applying any of the reset and set signals.

11. The circuit of claim 1, wherein the hot signal is applied to cause the programmable resistive element of said at least one nonvolatile memory cell to become substantially totally amorphous.

12. The circuit of claim 1, wherein the cold signal is applied to cause the programmable resistive element of said at least one nonvolatile memory cell to become substantially totally crystalline.

13. The circuit of claim 1, wherein the control circuitry applies at least one cycle of hot and cold signals, said cycle including multiple hot signals followed by at least one cold signal.

14. The circuit of claim 1, wherein the control circuitry applies at least one cycle of hot and cold signals, said cycle including at least one hot signal followed by multiple cold signals.

15. A method of operating a nonvolatile integrated circuit with a nonvolatile memory cell including a programmable resistive element storing data in a plurality of physical states, comprising:
applying signals to said nonvolatile memory cell to store data, comprising:
applying a reset signal to cause the programmable resistive element of said nonvolatile memory cell to store a first physical state of the plurality of physical states; and
applying a set signal to cause the programmable resistive element of said nonvolatile memory cell to store a second physical state of the plurality of physical states; and
applying signals to said nonvolatile memory cell to maintain an ability of said at least one nonvolatile memory cell to store data, comprising:
applying a hot signal to cause the programmable resistive element of said one nonvolatile memory cell to store the first physical state of the plurality of physical states, wherein the hot signal is applied to the programmable resistive element at a higher power relative to the reset signal; and
applying a cold signal to cause the programmable resistive element of said nonvolatile memory cell to store the second physical state of the plurality of physical states, wherein the cold signal is applied to the programmable resistive element for a longer duration relative to the set signal.

16. The method of claim 15, wherein at least one cycle of hot and cold signals is applied to the nonvolatile memory cell, after an interval of within which a plurality of cycles of the reset and set signals applied to the nonvolatile memory cell occurs or is likely to occur.

17. The method of claim 15, wherein at least one cycle of hot and cold signals is applied to the nonvolatile memory cell during power up events of a machine including the nonvolatile memory cell.

18. The method of claim 15, wherein at least one cycle of hot and cold signals is applied to the nonvolatile memory cell, prior to applying any of the reset and set signals.

19. The method of claim 15, wherein the hot signal is applied to cause the programmable resistive element of the nonvolatile memory cell to become substantially totally amorphous.

20. The method of claim 15, wherein the cold signal is applied to cause the programmable resistive element of the nonvolatile memory cell to become substantially totally crystalline.

21. A nonvolatile integrated circuit with a nonvolatile memory cell including a programmable resistive element storing data in a plurality of physical states, comprising:
means for applying signals to said nonvolatile memory cell to store data, comprising:
means for applying a reset signal to cause the programmable resistive element of said nonvolatile memory cell to store a first physical state of the plurality of physical states; and
means for applying a set signal to cause the programmable resistive element of said nonvolatile memory cell to store a second physical state of the plurality of physical states; and
means for applying signals to said nonvolatile memory cell to maintain an ability of said at least one nonvolatile memory cell to store data, comprising:
means for applying a hot signal to cause the programmable resistive element of said one nonvolatile memory cell to store the first physical state of the plurality of physical states, wherein the hot signal is applied to the programmable resistive element at a higher power relative to the reset signal; and
means for applying a cold signal to cause the programmable resistive element of said nonvolatile memory cell to store the second physical state of the plurality of physical states, wherein the cold signal is applied to the programmable resistive element for a longer duration relative to the set signal.

22. A method of forming a nonvolatile integrated circuit, comprising:
forming at least one nonvolatile memory cell, comprising:
a programmable resistive element having a plurality of physical states to store data;
forming control circuitry applying a plurality of electrical signals to said at least one nonvolatile memory cell, the plurality of electrical signals comprising:
a plurality of signals applied to said at least one nonvolatile memory cell to store data, including:
a reset signal to cause the programmable resistive element of said at least one nonvolatile memory cell to store a first physical state of the plurality of physical states;
a set signal to cause the programmable resistive element of said at least one nonvolatile memory cell to store a second physical state of the plurality of physical states;
a plurality of signals applied to said at least one nonvolatile memory cell to maintain an ability of said at least one nonvolatile memory cell to store data, including:
a hot signal to cause the programmable resistive element of said at least one nonvolatile memory cell to store the first physical state of the plurality of physical states, wherein the hot signal is applied to the programmable resistive element at a higher power relative to the reset signal;
a cold signal to cause the programmable resistive element of said at least one nonvolatile memory cell to store the second physical state of the plurality of physical states, wherein the cold signal is applied to the programmable resistive element for a longer duration relative to the set signal.

* * * * *